United States Patent
Maung et al.

(10) Patent No.: US 11,068,428 B2
(45) Date of Patent: Jul. 20, 2021

(54) ADJUSTABLE EMBEDDED UNIVERSAL SERIAL BUS 2 LOW-IMPEDANCE DRIVING DURATION

(71) Applicant: TEXAS INSTRUMENTS INCORPORATED, Dallas, TX (US)

(72) Inventors: Win Naing Maung, Plano, TX (US); Yonghui Tang, Plano, TX (US); Huanzhang Huang, Plano, TX (US); Douglas Edward Wente, Murphy, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/414,496

(22) Filed: May 16, 2019

(65) Prior Publication Data
US 2020/0057742 A1    Feb. 20, 2020

Related U.S. Application Data

(60) Provisional application No. 62/764,940, filed on Aug. 16, 2018.

(51) Int. Cl.
*G06F 13/00* (2006.01)
*G06F 13/40* (2006.01)
*G06F 13/42* (2006.01)

(52) U.S. Cl.
CPC ...... *G06F 13/4022* (2013.01); *G06F 13/4282* (2013.01); *G06F 2213/0042* (2013.01)

(58) Field of Classification Search
CPC .. G06F 13/00; G06F 13/4022; G06F 13/4282; G06F 2213/0042

(Continued)

(56) References Cited

U.S. PATENT DOCUMENTS

| 6,615,301 B1 | 9/2003 | Lee et al. |
| 2014/0244889 A1* | 8/2014 | Sasson ................ G06F 13/4022 710/316 |

(Continued)

FOREIGN PATENT DOCUMENTS

| CN | 1220943 | 9/2005 |

OTHER PUBLICATIONS

International Search Report in corresponding PCT Patent Application No. PCT/US2019/046564, dated Nov. 14, 2019 (2 pages).

(Continued)

*Primary Examiner* — Tim T Vo
*Assistant Examiner* — Kim T Huynh
(74) *Attorney, Agent, or Firm* — John R. Pessetto; Charles A. Brill; Frank D. Cimino

(57) ABSTRACT

Aspects of the present disclosure provide for a system. In at least some examples, the system includes an embedded Universal Serial Bus 2 (eUSB2) device having a first receiver and a first transmitter, a processor, a second transmitter coupled to the processor, a second receiver coupled to the processor, a drive low circuit coupled to the processor second transmitter, and differential signal lines having a length greater than ten inches. The differential signal lines are coupled at a first end to the first receiver and the first transmitter and at a second end to the second transmitter and the second receiver. The processor is configured to control the drive low circuit to drive the differential signal lines low with a logic '0' to cause the first receiver to receive the logic '0' and a value of a signal present on the differential signal lines to reach about 0 volts.

6 Claims, 3 Drawing Sheets

(58) Field of Classification Search
USPC .............................. 710/316, 305–306, 100
See application file for complete search history.

(56) References Cited

U.S. PATENT DOCUMENTS

| | | | |
|---|---|---|---|
| 2015/0227489 A1* | 8/2015 | Chen ................... | G06F 13/4291 |
| | | | 710/313 |
| 2016/0174361 A1* | 6/2016 | Chen .................... | H05K 3/4644 |
| | | | 333/5 |
| 2018/0173666 A1* | 6/2018 | Srivastava .............. | H04L 69/18 |

OTHER PUBLICATIONS

Compaq Computer Corporation et al., "Universal Serial Bus Specification," Revision 2.0, Apr. 27, 2000, 650 p. [Online: https://www.usb.org/document-library/usb-20-specification].

Compaq Computer Corporation, "USB 2.0 Adopters Agreement," Apr. 14, 2011, 6 p. [Online: https://www.usb.org/document-library/usb-20-specification].

Compaq Comuter Corporation et al., "Errata for 'USB Revision 2.0 Apr. 27, 2000' as of Dec. 7, 2000," 31 p. [Online: https://www.usb.org/document-library/usb-20-specification].

Compaq Comuter Corporation et al., "USB 2.0 Specification Engineering Change Notice (ECN) #1: Mini-B Connector," Oct. 20, 2000, 45 p. [Online: https://www.usb.org/document-library/usb-20-specification].

Compaq Computer Corporation et al., "Pull-Up/Pull-Down Resistors," USB Engineering Change Notice, 5 p. [Online: https://www.usb.org/document-library/usb-20-specification].

Compaq Computer Corporation et al., "Errata for 'USB Revision 2.0 Apr. 27, 2000' as of May 28, 2002," 7 p. [Online: https://www.usb.org/document-library/usb-20-specification].

Compaq Computer Corporation et al., "Interface Association Descriptors," USB Engineering Change Notice, 5 p. [Online: https://www.usb.org/document-library/usb-20-specification].

Compaq Computer Corporation et al., "Rounded Chamfer," Engineering Change Notice, Oct. 8, 2003, 3 p. [Online: https://www.usb.org/document-library/usb-20-specification].

Compaq Computer Corporation et al., "Unicode UTF-16LE for String Descriptors," USB Engineering Change Notice, Feb. 21, 2005, 2 p. [Online: https://www.usb.org/document-library/usb-20-specification].

Compaq Computer Corporation et al., "Inter-Chip USB Supplement to the USB 2.0 Specification," Revision 1.0, Mar. 13, 2006, 48 p. [Online: https://www.usb.org/document-library/usb-20-specification].

Compaq Computer Corporation et al., "Device Class Specification Adopters Agreement," Apr. 4, 2007, 5 p. [Online: https://www.usb.org/document-library/usb-20-specification].

Compaq Computer Corportion et al., "USB 2.0 Link Power Management Addendum," Engineering Change Notice, Jul. 16, 2007, 29 p. [Online: https://www.usb.org/document-library/usb-20-specification].

Compaq Computer Corporation et al., "High-Speed Inter-Chip USB Electrical Specification," Version 1.0, Sep. 23, 2007, 16 p. [Online: https://www.usb.org/document-library/usb-20-specification].

Compaq Computer Corporation et al., "Suspend Current Limit Changes," USB Engineering Change Notice, Apr. 9, 2008, 2 p. [Online: https://www.usb.org/document-library/usb-20-specification].

Compaq Computer Corporation et al., "5V Short Circuit Withstand Requirement Change," USB Engineering Change Notice, Dec. 22, 2008, 2 p. [Online: https://www.usb.org/document-library/usb-20-specification].

Compaq Computer Corporation et al., "Device Capacitance," USB Engineering Change Notice, Dec. 22, 2008, 2 p. [Online: https://www.usb.org/document-library/usb-20-specification].

Compaq Computer Corporation et al., "Material Change," USB Engineering Change Notice, Dec. 22, 2008, 3 p. [Online: https://www.usb.org/document-library/usb-20-specification].

Compaq Computer Corporation et al., "USB 2.0 Phase-Locked SOFs," USB Engineering Change Notice, Dec. 22, 2008, 2 p. [Online: https://www.usb.org/document-library/usb-20-specification].

Compaq Computer Corporation et al., "USB 2.0 DC Resistance," USB Engineering Change Notice, Dec. 22, 2008, 8 p. [Online: https://www.usb.org/document-library/usb-20-specification].

Compaq Computer Corporation et al., An Examination of the Effect of Power to Signal & of Signal to Power (Supplement for XV-4687C), Dec. 2, 2009, 15 p. [Online: https://www.usb.org/document-library/usb-20-specification].

Compaq Computer Corporation et al., "Clarification on the Chamfer on USB 2.0 Micro Connectors," USB Engineering Change Notice, Mar. 23, 2010, 4 p. [Online: https://www.usb.org/document-library/usb-20-specification].

Compaq Computer Corporation et al., "Maximum Un-Mating Force Value Definition to Micro Connector USB 2.0," Mar. 23, 2010, 3 p. [Online: https://www.usb.org/document-library/usb-20-specification].

Compaq Computer Corporation et al., "'On-The-Go Supplement to the USB 2.0 Specification' Adopters Agreement," May 26, 2009, 1 p. [Online: https://www.usb.org/document-library/usb-20-specification].

Compaq Computer Corporation et al., "USB Test_Mode Selector Values," USB Engineering Change Notice, Jul. 26, 2010, 3 p. [Online: https://www.usb.org/document-library/usb-20-specification].

Compaq Computer Corporation et al., "Errata for USB 2.0 ECN: Link Power Management (LPM)—Jul. 2007," Sep. 28, 2011, 8 p. [Online: https://www.usb.org/document-library/usb-20-specification].

Compaq Computer Corporation et al., "On-The-Go and Embedded Host Supplement to the USB Revision 2.0 Specification," Revision 2.0 version 1.1a, Jul. 27, 2012, 96 p. [Online: https://www.usb.org/document-library/usb-20-specification].

Compaq Computer Corporation et al., "HSIC ECN," USB Engineering Change Notice, May 21, 2012, 6 p. [Online: https://www.usb.org/document-library/usb-20-specification].

Compaq Computer Corporation et al., USB 2.0 Connect Timing Update, USB Engineering Change Notice, Apr. 4, 2013, 6 p. [Online: https://www.usb.org/document-library/usb-20-specification].

Compaq Computer Corporation et al., "Disconnect Supplement to High Speed Inter Chip Specification," Revision 1.0, Sep. 18, 2013, 8 p. [Online: https://www.usb.org/document-library/usb-20-specification].

Compaq Computer Corporation et al., "USB 2.0 VBUS Max Limit," Aug. 11, 2014, 5 p. [Online: https://www.usb.org/document-library/usb-20-specification].

Compaq Computer Corporation et al., "Maximum Vbus Voltage," Nov. 26, 2014, 4 p. [Online: https://www.usb.org/document-library/usb-20-specification].

"Quad Type Cable Additional for Micro USB," 3 p.

"MicroUSB Micro-B ID Pin Resistance and Tolerance Stack-Up between D+ and D−," USB Engineering Change Notice, 2 p.

Compaq Computer Corporation et al., Universal Serial Bus Micro-USB Cables and Connectors Specification, Revision 1.01, Apr. 4, 2007, 36 p.

Fujikura Ltd., "ECN Proposal for Micro-USB Cables," Aug. 15, 2008, 23 p.

Compaq Computer Corporation et al., "On-The-Go and Embedded Host Supplement to the USB Revision 2.0 Specification," Revision 2.0, version 1.1a, Jul. 27, 2012, 96 p.

Apple Inc. et al., Embedded USB2 (eUSB2) Physical Layer Supplement to the USB Revision 2.0 Specification, Revision 1.1, Copyright 2018 Apple Inc. et al., 164 p.

* cited by examiner

US 11,068,428 B2

1

ADJUSTABLE EMBEDDED UNIVERSAL SERIAL BUS 2 LOW-IMPEDANCE DRIVING DURATION

CROSS-REFERENCE TO RELATED APPLICATIONS

The present application claims priority to U.S. Provisional Patent Application No. 62/764,940, which was filed Aug. 16, 2018, is titled "ADJUSTABLE DURATION FOR EDP/EDM LOW IMPEDANCE STATE TO AVOID THE LINE STATE REMAINING AT AN ELEVATED VOLTAGE LEVEL INSTEAD OF LOW DUE TO LARGE CHANNEL PROPAGATION DELAY FROM LONGER CHANNEL LENGTH," and is hereby incorporated herein by reference in its entirety.

SUMMARY

Aspects of the present disclosure provide for a system. In at least some examples, the system includes an embedded Universal Serial Bus 2 (eUSB2) device having a first receiver and a first transmitter, a processor, a second transmitter coupled to the processor, a second receiver coupled to the processor, a drive low circuit coupled to the processor second transmitter, and differential signal lines having a length greater than ten inches. The differential signal lines are coupled at a first end to the first receiver and the first transmitter and at a second end to the second transmitter and the second receiver. The processor is configured to control the drive low circuit to drive the differential signal lines low with a logic '0' to cause the first receiver to receive the logic '0' and a value of a signal present on the differential signal lines to reach about 0 volts.

Other aspects of the present disclosure provide for a method. In at least some examples, the method includes transmitting an end of packet (EOP) indicator via differential signal lines, after transmitting the EOP indicator, driving the differential signal lines low for a period of 4 unit intervals plus a value of a propagation delay existing on the differential signal lines, and after driving the differential signal lines low for the period of 4 unit intervals plus the value of the propagation delay existing on the differential signal lines, placing the differential signal lines in a high-impedance (high-z) state.

Other aspects of the present disclosure provide for a circuit. In at least some examples, the circuit includes an amplifier having a first output coupled to a first node and a second output coupled to a second node. The circuit further includes a first resistor coupled between the second node and a ground terminal and a second resistor coupled between the first node and the ground terminal. The circuit further includes a third resistor, a fourth resistor, a first switch coupled to the first resistor, and a second switch coupled to the second resistor.

BRIEF DESCRIPTION OF THE DRAWINGS

For a detailed description of various examples, reference will now be made to the accompanying drawings in which.

2

Figure 3:
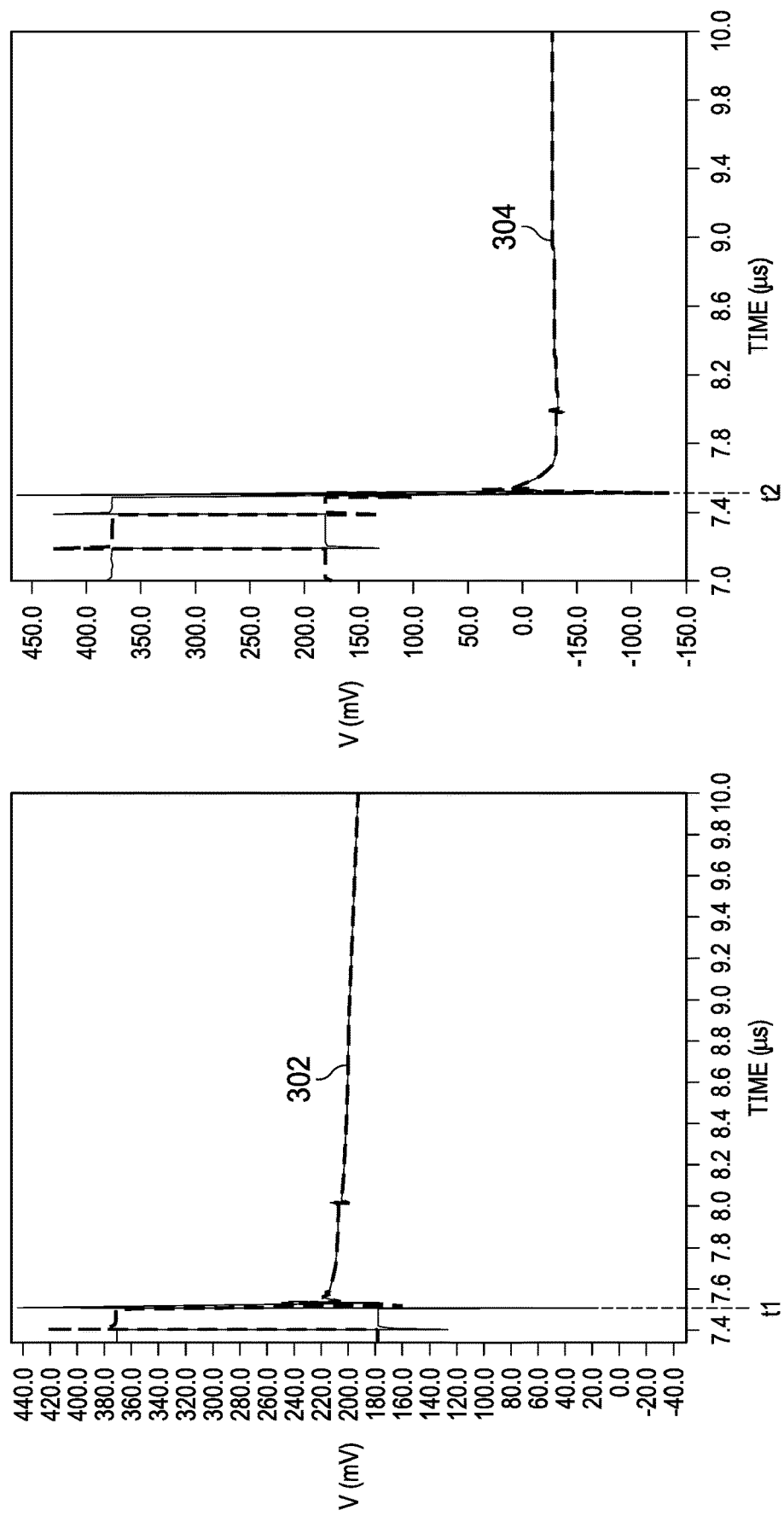
Figure 4:
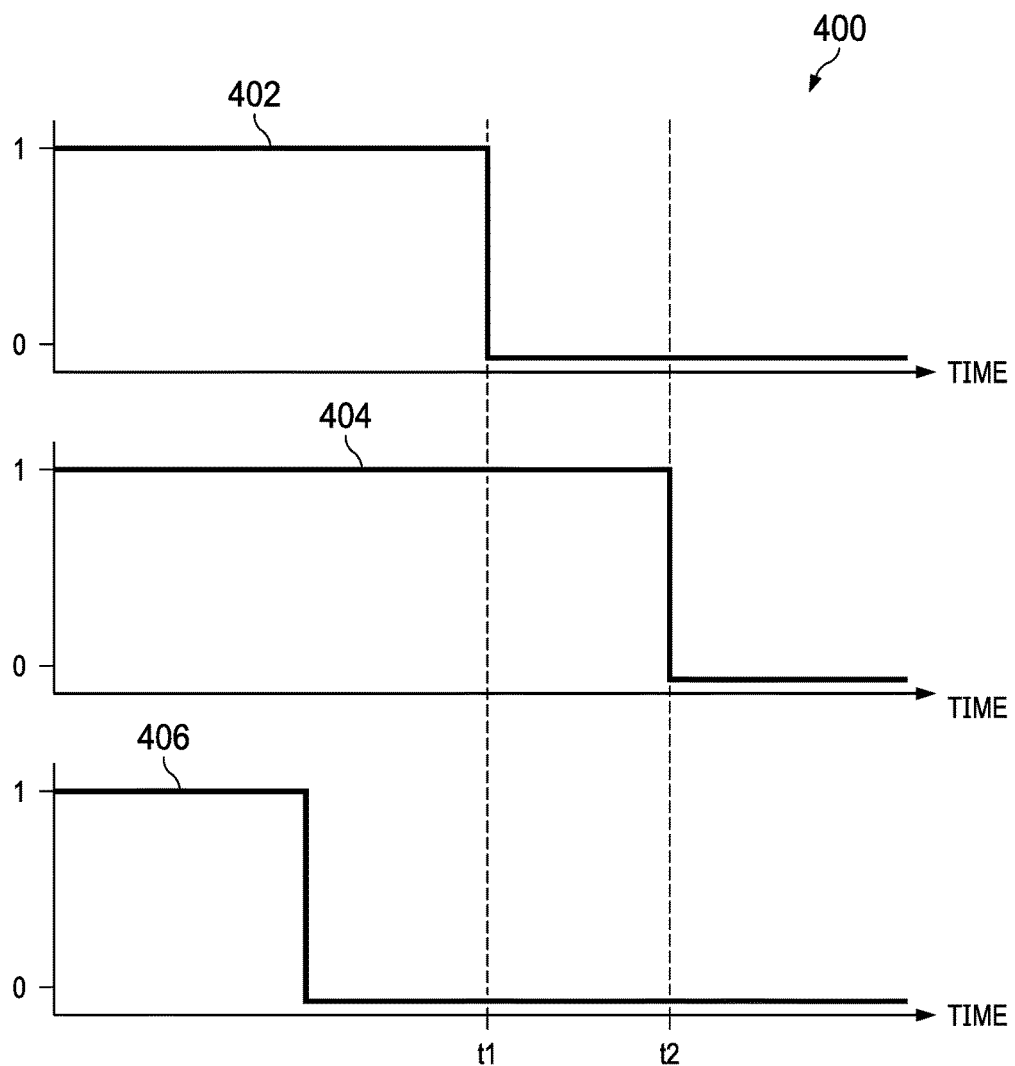
Figure 5:
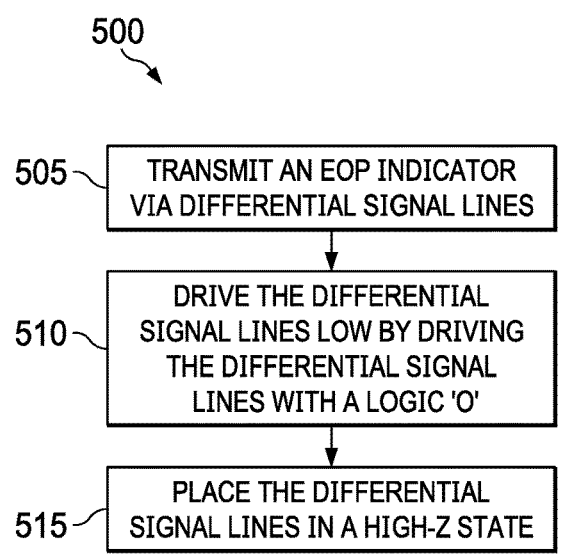

FIG. 3 shows a diagram of illustrative waveforms in accordance with various examples;

FIG. 4 shows a diagram of illustrative waveforms in accordance with various examples; and FIG. 5 shows a flowchart of an illustrative method in accordance with various examples.

DETAILED DESCRIPTION

Universal Serial Bus (USB) is a standard establishing specifications for interconnect cabling, connectors, and communication protocols. As referred to herein, USB refers to any version of the USB specification, including any amendments or supplements, certified by the USB Implementers Forum (USB IF) or any suitable body who replaces and/or aids the USB IF in its role overseeing the USB specification, whether now existing or later developed. In at least one example, USB, as referred to herein, encompasses any one or more of the USB 1.0 specification, USB 2.0 specification, USB 3.0 specification, USB 4.0 specification, or any derivatives thereof, such as amended or ".x" variations of the above specifications. Also, as referred to herein, legacy USB refers to USB 2.x and/or USB 1.x. Embedded USB (eUSB), in at least some examples, refers to eUSB2.

At its inception, USB was primarily intended for implementation in specifying standards for connection and communication between personal computers and peripheral devices. However, as adoption of the USB standard has expanded and implementation in computing devices of support for the USB standard has gained in popularity, efforts have been made to extend and expand the applicability of USB. For example, while initially establishing specifications for communications between personal computers and peripheral devices, USB has expanded to communication between peripheral devices, between personal computers, and other use cases. As a result of such widespread implementation and use of USB, efforts are being further made to utilize USB as a communication protocol among individual subsystems or circuits (e.g., such as a system-on-a-chip (SoC)). Such implementations are sometimes referred to as eUSB2. New challenges arise in implementing eUSB2. For example, at a circuit level, computing devices often operate at voltage levels that vary from those of conventional USB, creating an impediment between direct communication between eUSB2 and legacy USB systems. To mitigate this impediment, an eUSB2 repeater operates as a bridge or non-linear re-driver between eUSB2 and legacy USB systems, or vice versa, to translate between legacy USB signaling voltage levels that are customarily about 3.3 volts (V) and eUSB2 signaling voltages levels that are circuit-level (e.g., silicon appropriate voltages) such as about 1.0 V, 1.2 V, 1.4 V, or any other suitable value less than 3.3 V.

After a final bit of an end of packet (EOP) indicator of communication in an eUSB2 system is transmitted via differential signal lines, in at least some examples the eUSB2 specification requires a transmitter (or a circuit coupled to an output of the transmitter) to drive the differential signal lines low (e.g., couple each of the differential input signals to a ground potential through an about 40 ohm, or other comparatively small value, resistor) for a maximum of 4 unit intervals (UIs), where a unit interval is the period of time for transmitting 1 bit of data. In at least some examples, driving the differential signals low is synonymous with driving the differential signal lines with a logic '0' through a low resistance path. Driving the each of the differential signal lines low, in at least some examples, is intended to clear each of the signal lines of any data or voltage remaining on either of the differential signal lines. After the differential signal lines are driven low, a weak pull-down is activated to place the differential signal lines in a high-impedance (e.g., high-z) state, enabling, in some examples, single-ended communication via either of the differential signal lines or a receiving device to then begin transmitting over the differential signal lines. The high-impedance state is defined as, in some examples, coupling each of the differential signal lines to the ground potential (e.g., driving the differential signal lines with a logic '0') through an about 7 kiloohm, or other comparatively large value, resistor or resistance path. However, when a physical length of the differential signal lines is sufficient to cause a propagation delay of 1 UI or greater to exist on either of the differential signal lines, the differential signal lines may transition to the high-impedance state prior to a full length of the differential signal lines being driven low. Accordingly, in at least some examples it is desirable to modify the drive-low protocol of an eUSB2 system to cause a drive low circuit in the eUSB2 system to drive differential signal lines low for an extended duration of time exceeding existing eUSB2 specification of driving with a low impedance for 4 UI while not inhibiting an ability of a receiving device to then begin transmitting on the differential signal lines.

At least some aspects of the present disclosure provide for a circuit. The circuit, in at least some examples, includes an eUSB2 transmitter and a drive low circuit. In some examples, the circuit is an eUSB2 repeater suitable for use in interfacing between eUSB2 and USB interfaces. The circuit, in at least some examples, provides for the transmission of data via a transmitter via eUSB2 protocols and/or specification. The data is transmitted, in some examples, via differential signal lines. In at least some examples, after a final transition of an EOP indicator of the data (e.g., either a falling edge or a rising edge indicating an end of the EOP indicator and therefore an end of transmission of the data), the circuit drives the differential signal lines low. In at least some examples, the circuit drives the differential signal lines low by coupling each of the differential signal lines to a ground potential through a resistor having a resistance of less than about 100 ohms (e.g., such as an about 40 ohm resistor). The circuit drives the differential signal lines low, in some examples, to clear the differential signal lines of any residual voltage, current, charge, or other remnant of the data previously transmitted via the differential signal lines. In at least some examples, the circuit drives the differential signal lines low for about 4 UI plus a propagation delay associated with the differential signal lines. For example, at a time of manufacture of the circuit and/or a system including both the circuit and the differential signal lines, the propagation delay of the differential signal lines is determined, such as through testing, tuning, verification, or any other suitable process. Based on the determined propagation delay, the circuit drives the differential signal lines low for a sufficient period of time for the low signal to reach an end of the differential signal lines. After driving the differential signal lines low, the circuit places the differential signal lines in a weak pull-down state, coupling each of the differential signal lines to the ground potential through a resistor having a comparatively large resistance when compared to the resistor used in driving the differential signal lines low (e.g., such as a resistor having a resistance of about 7 kiloohms). It at least some examples, despite the circuit driving the differential signal lines low for an extended period of time approximately equal to 4 UI plus the propagation delay of the differential signal lines, a receiving device is able to begin transmitting over the differential signal lines 4 UI after receiving the EOP indicator because of the circuit placing the differential signal lines in the weak-pull down state for 4 UI plus the propagation delay of the differential signal lines after transmitting the EOP indicator. Driving the differential signal lines low for the extended period of time, in at least some examples, provides for the low driven signal to reach an end of the differential signal lines despite the propagation delay of the differential signal lines.

Figure 1:
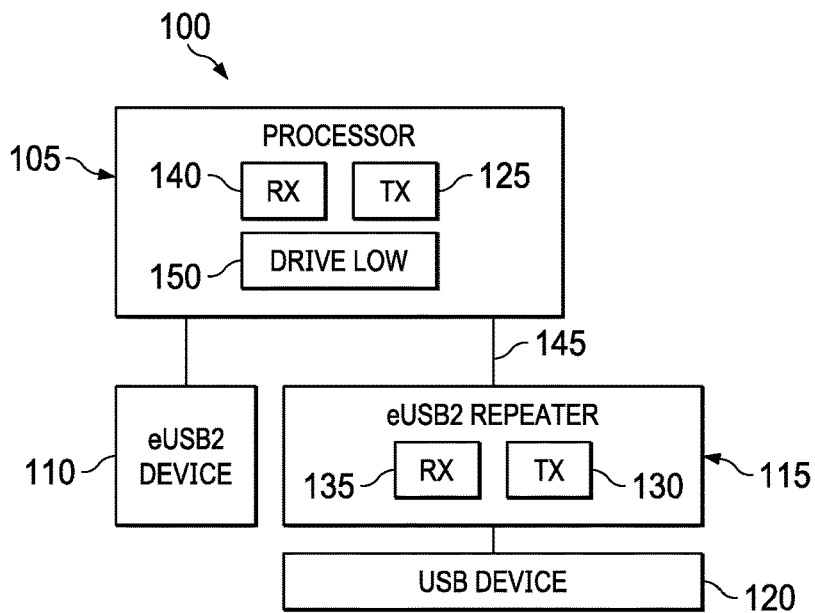
FIG. 1 shows a block diagram of an illustrative system in accordance with various examples.

Turning now to FIG. 1, a block diagram of an illustrative system 100 is shown. In at least some examples, the system 100 is illustrative of a computing device, or elements of a computing device. For example, the system 100 includes a processor 105, an eUSB2 device 110, an eUSB2 repeater 115, and a USB device 120. In at least some examples, the processor 105 includes, or is coupled to, a transmitter (TX) 125, a receiver (RX) 140, and a drive-low circuit 150, and the eUSB2 repeater 115 includes a TX 130 and a RX 135. The USB device 120 is a legacy USB device, as described elsewhere herein. In some examples, one or both of the eUSB2 device 110 or the USB device 120 is implemented external to the system 100 and configured to couple to the system 100 through an appropriate interface (e.g., such as a port and receptacle suitable for performing communication according to eUSB2 or USB protocol, respectively. The processor 105 is, in some examples, a SoC. The eUSB2 device 110 is any device operating in both ingress and egress communication directions according to signal voltage level specifications for eUSB2. The USB device 120 is any device operating in both ingress and egress communication directions according to signal voltage level specifications for legacy USB. For example, in at least some implementations the USB device 120 is a peripheral such as a user input device, (e.g., a sensor, a scanner, an imaging device, a microphone, etc.), an output device (e.g., a printer, speakers, etc.), a storage device, or any other peripheral, component, or device suitable for communicating with the processor 105.

The eUSB2 repeater 115 communicatively couples the processor 105 to the USB device 120 and vice versa, converting signals appropriate for the processor 105 to signals appropriate for the USB device 120 and vice versa. For example, in some implementations signaling in the processor 105 is performed in a range of about 0.8 V to about 1.4 V. Similarly, in some implementations signaling in the USB device 120 is performed at about 3.3 V or about 5 V. In at least some examples, the eUSB2 repeater 115 operates as a bit-level repeater, receiving signals from one of the processor 105 or USB device 120 and converting the signals for use by the other of the processor 105 or USB device 120 (e.g., by shifting a voltage level of the signals upward or downward based on a direction of the communications). In some examples, differential data communicated in the system 100 begins with a start of packet (SOP) indicator and ends with an EOP indicator.

In at least some examples, the TX 125 transmits data according to eUSB2 protocols or standards via differential signal lines 145 that is received by the RX 135 and the TX 130 transmits data according to eUSB2 protocols or standards via the differential signal lines 145 that is received by the RX 140. For example, after the RX 135 receives an EOP indicator from the TX 125 and the differential signal lines are driven low (as seen at the RX 135) for 4 UI by the drive low circuit 150, the TX 130 is permitted to begin transmitting data via the differential signal lines 145. In at least some examples, the differential signal lines 145 have a length sufficient to create a propagation delay between the TX 125 and the RX 135 of 1 UI or greater. When the propagation delay between the TX 125 and the RX 135 is 1 UI or greater and the drive low circuit 150 drives the differential signal lines 145 low for 4 UI and then subsequently places the differential signal lines 145 in a high-z state, the RX 135, in some examples, does not see the differential signal lines 145 being driven low for the full 4 UI and energy remains on the differential signal lines 145. Instead, in at least some examples, the RX 135 sees the differential signal lines 145 driven low for less than about 4 UI. Accordingly, the TX 130 does not become aware that the differential signal lines 145 are available for transmission to the RX 140. For example, in at least some implementations of the system 100 in which the differential signal lines 145 have a length greater than about 10 inches, driving the differential signal lines 145 low (e.g., driving the differential signal lines with a logic '0') for 4 UI is insufficient to fully propagate the logic '0' to the RX 135. In at least some examples, the processor 105 has prior knowledge of a propagation delay of the differential signal lines 145 and/or the processor 105 determines a propagation delay of the differential signal lines 145 according to any suitable known signaling technique for determining delay. Based on the known or determined propagation delay, the processor 105 increases a duration of time that the drive low circuit 150 drives the differential signal lines 145 with a logic '0' after the TX 125 transmits an EOP indicator. For example, when the propagation delay of the differential signal lines 145 is about $\chi$ UI, where $\chi$ is a non-negative integer number (e.g., 0, 1, 2, . . . ), the processor 105 controls the drive low circuit 150 to drive the differential signal lines 145, after transmitting an EOP indicator, with a logic '0' for about a period of about $(Y+\chi)$ UI, where Y is a value in a range of [1,4]. In at least some examples, as used herein for ease of description, Y has a value of 4. In at least some examples, after controlling the drive low circuit 150 to drive a logic '0' for about $(4+\chi)$ UI, the processor 105 controls the drive low circuit 150 to place the differential signal lines 145 in a high-z state, for example, controlling the drive low circuit 150 to couple each of the differential signal lines to the ground potential through a path that includes about 7 kiloohms of resistance.

In at least some examples, driving the differential signal lines 145 with the logic '0' for about $(4+\chi)$ UI exceeds an amount of time permitted by existing eUSB2 standards (e.g., of drive-low for 4 UI). However, because the RX 135 first receives the EOP indicator with a propagation delay of $\chi$ UI and the TX 130 then waits 4 UI before attempting to transmit, when the TX 130 begins transmitting 4 UI after receipt of the EOP indicator, the differential signal lines have been released from the drive-low state and the system remains in compliance with eUSB2 standards from the perspective of the RX 135 and TX 130. In this way, the differential signal lines 145 of greater than 10 inches in length are fully-driven low despite the propagation delay of $\chi$ UI and without inhibiting operation of the RX 135 and/or TX 130.

In at least some examples, after the drive low circuit 150 drives the differential signal lines 145 with the logic '0' for $(4+\chi)$ UI and places the differential signal lines 145 in the high-z state, the TX 130 begins transmitting data beginning with an SOP indicator to the processor 105 via the RX 140. After the TX 130 transmits an EOP indicator to the RX 140, a processor (not shown) of the eUSB2 repeater 115 controls the TX 130, or a drive low circuit (not shown) of the eUSB2 repeater 115, to drive the differential signals with a logic '0" for about $(4+\chi)$ UI and place the differential signal lines 145 in the high-z state in substantially the same manner as discussed above with respect to the TX 125.

Figure 2A:
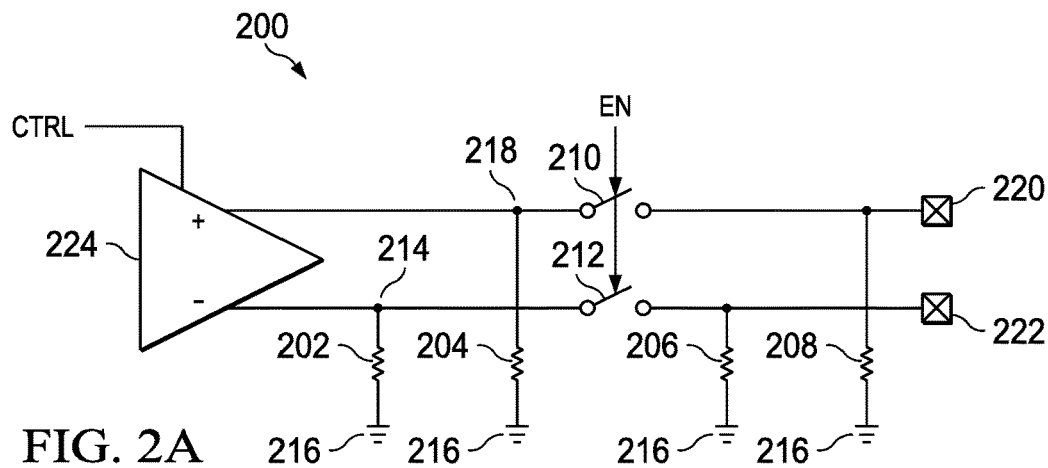
FIG. 2A shows a schematic diagram of an illustrative circuit in accordance with various examples.
Figure 2B:
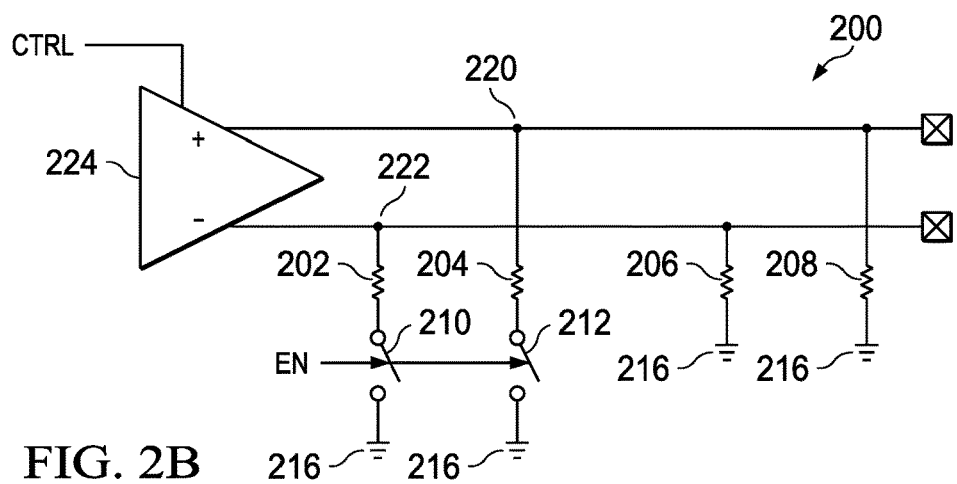
FIG. 2B shows a schematic diagram of an illustrative circuit in accordance with various examples.

Turning now to FIGS. 2A and 2B, a schematic diagram of a circuit 200 is shown. In at least some examples, the circuit 200 is suitable for implementation as the drive-low circuit 150 of the system 100 of FIG. 1. For example, in at least some implementations the circuit 200 is electrically positioned in series between an output of a transmitter (e.g., such as an amplifier) in an eUSB2 and terminals at which the transmitter couples to differential signaling lines to transmit a differential signal.

In at least some examples, the circuit 200 includes a resistor 202, a resistor 204, a resistor 206, a resistor 208, a switch 210, and a switch 212. In at least one example architecture, as illustrated by FIG. 2A, the resistor 202 is coupled between a node 214 and ground terminal 216, the resistor 204 is coupled between a node 218 and the ground terminal 216, the resistor 206 is coupled between a node 220 and the ground terminal 216, and the resistor 208 is coupled between a node 222 and the ground terminal 216. The switch 210 is coupled between the node 218 and the node 222 and the switch 212 is coupled between the node 214 and the node 220. In at least some examples, the circuit 200 is configured to couple to a differential amplifier 224 (e.g., such as an amplifier operational as a transmitter) at the node 214 and the node 218 in series with transmission lines (e.g., as represented as the node 220 and the node 220) coupled to the differential amplifier 224. The differential amplifier 224 is, in some examples, an eUSB2 transmitter, controllable to output a signal, or not output the signal, based on a received control signal CTRL. The node 220 and the node 222 are, in at least some examples, terminals of a differential signal line in an eUSB2 system (e.g., eD− and eD+ terminals, respectively). The switch 210 and the switch 212, in at least some examples, are each any component suitable for, or capable of, switching a signal between the node 218 and the node 222 and between the node 214 and the node 220, respectively, based on a control signal EN. In at least some examples, the switch 210 and the switch 212 are each implemented as respective transistors.

Alternatively, in at least one example architecture, as illustrated by FIG. 2B, the resistor 202 is coupled between a node 222 and the ground terminal 216 via the switch 210, the resistor 204 is coupled between a node 220 and the ground terminal 216 via the switch 212, the resistor 206 is coupled between the node 222 and the ground terminal 216, and the resistor 208 is coupled between the node 220 and the ground terminal 216. In at least some examples, the circuit 200 is configured to couple to a differential amplifier 224 (e.g., such as an amplifier operational as a transmitter) at the node 222 and the node 220 in parallel with transmission lines (e.g., as represented as the node 222 and the node 220) coupled to the differential amplifier 224. The differential amplifier 224 is, in some examples, an eUSB2 transmitter, controllable to output a signal, or not output the signal, based on a received control signal CTRL. The node 222 and the node 220, in at least some examples, terminals of a differential signal line in an eUSB2 system (e.g., eD− and eD+ terminals, respectively). The switch 210 and the switch 212, in at least some examples, are each any component suitable for, or capable of, switching a signal between the resistor 202 and the ground terminal 216 and between the resistor 204 and the ground terminal 216, respectively, based on a control signal EN. In at least some examples, the switch 210 and the switch 212 are each implemented as respective transistors.

In at least some examples of operation of the circuit 200, the switches 210 and 212 are controlled via EN to control a pull-down strength present at the node 222 and the node 220, respectively. For example, when EN has a logical low value, the switch 210 and the switch 212 are each in an open state. When the switch 210 and the switch 212 are each in the open state, a pull-down strength present at the node 222 is determined according to a resistance of the resistor 206 and a pull-down strength present at the node 220 is determined according to a resistance of the resistor 208. When EN has a logical high value, the switch 210 and the switch 212 are each in a closed state. When the switch 210 and the switch 212 are each in the closed state, the pull-down strength present at the node 222 is determined according to the resistance of the resistor 206 in parallel combination with a resistance of the resistor 202 (and any additional resistance added by the switch 210) and the pull-down strength present at the node 220 is determined according to a resistance of the resistor 208 in parallel combination with a resistance of the resistor 204 (and any additional resistance added by the switch 212). In at least some examples, the resistor 202 and the resistor 204 each have a resistance of about 40 ohms and the resistor 206 and the resistor 208 each have a resistance of about 7 kiloohms. In this way, a pull-down strength present at the node 222 and a pull-down strength present at the node 220 can be dynamically controlled by the switch 210 and the switch 212, respectively, based on a value of EN to provide a strong pull-down or a weak pull-down at the node 222 and the node 220.

Turning now to FIG. 3, a diagram 300 of illustrative waveforms is shown. In at least some examples, the diagram 300 includes a waveform 302 and a waveform 304. The waveform 302 is representative of signals present on the differential signal lines 145 of the system 100 of FIG. 1 when a propagation delay exists on the differential signal lines 145 and the differential signal lines 145 are not driven low for greater than 4 UI after transmission of an EOP indicator. The waveform 304 is representative of signals present on the differential signal lines 145 when a propagation delay exists on the differential signal lines 145 and the differential signal lines 145 are driven low after transmission of an EOP indicator for a period of 4 UI plus the duration of the propagation delay.

As shown by the waveform 302, after completion of transmission of the EOP indicator at a time t1, a line state of the differential signal lines 145 (e.g., a voltage present on the differential signal lines 145) remains elevated, not going low because the logic '0' driven from one end of the differential signal lines 145 does not reach the other end of the differential signal lines 145 because of the propagation delay. As shown by the waveform 304, after completion of transmission of the EOP indicator at a time t2, a line state of the differential signal lines 145 goes low within about 4 UI resulting from the extended duration that the differential signal lines 145 are driven low by a drive low circuit.

Turning now to FIG. 4, a diagram 400 of illustrative waveforms is shown. In at least some examples, the diagram 400 includes a waveform 402, a waveform 404, and a waveform 406. The waveform 402 is representative of a control signal for controlling the driving low of differential signal lines in a system that does not extend the driving time to compensate for a propagation delay of the differential signal lines. In at least one example, the waveform 402 corresponds to a same system as the waveform 302 of the diagram 300 of FIG. 3 in which the duration of driving the differential signal lines is not extended and therefore the differential signal lines are prevented from going low because of the propagation delay of the differential signal lines. The waveform 404 is representative of a control signal for controlling the driving low of differential signal lines in a system that extends the driving time to compensate for the propagation delay of the differential signal lines. In at least one example, the waveform 404 corresponds to a same system as the waveform 304 of the diagram 300 in which the duration of driving the differential signal lines is extended and therefore the differential signal lines are fully driven low despite the propagation delay of the differential signal lines. For example, the waveform 404 is a signal as would be generated by the processor 105 for controlling the drive-low circuit 150 (e.g., such as for controlling one or more switches that couple the differential signal lines to a ground potential through a resistor or a path having a resistance of about 40 ohms). In at least some examples, the waveform 406 is a signal as would be generated by the processor 105 for controlling the TX 125 (e.g., an enable signal for the TX 125). In at least some examples, the duration of time between time t1 and time t2 illustrated in FIG. 4 corresponds to the known or determined propagation delay of the differential signal lines, and therefore a duration by which the driving low of the differential signal lines is extended.

Turning now to FIG. 5, a flowchart of an illustrative method 500 is shown. In at least some examples, the method 500 corresponds to actions performed by one or more components of the system 100 of FIG. 1. The method 500 is, in some examples, a method for controlling a drive low circuit, such as a drive low circuit coupled to a transmitter in an eUSB2 system. The control is exerted, in various examples, by any suitable component having processing capabilities such as a processor, a microprocessor, a logic circuit, etc. Implementation of the method 500 by a circuit, in at least some examples, is advantageous in ensuring that differential signal lines in the eUSB2 system are fully driven low despite the transmitter driving the differential signal lines low for a period of time longer than permitted by eUSB2 protocols or standards.

At operation 505, a transmitter is controlled to transmit an EOP indicator via differential signal lines. The EOP indicator is, in various examples, a series of static value bits having a length defined and/or limited by eUSB2 standards. The EOP indicator, in some examples, follows transmission of differential data via the differential signal lines.

At operation 510, a circuit is controlled to drive the differential signal lines low by driving the differential signal lines with a logic '0'. In at least some examples, the circuit drives the differential signal lines low by coupling the differential signal lines to a ground potential through a resistor or path having a resistance of about 40 ohms. The circuit is controlled to drive the differential signal lines low for a period of about $(4+\chi)$ UI, where $\chi$ is a non-negative integer representative of a propagation delay of the differential signal lines resulting at least partially from a length of the differential signal lines. When the differential signal lines are less than about 10 inches in length, or the differential signal lines otherwise do not have a propagation delay of at least 1 UI, $\chi$ is 0 and the circuit is controlled to drive the differential signal lines low for a period of about 4 UI. However, when X is non-zero, the circuit is controlled to drive the differential signal lines low for greater than 4 UI. In at least some examples, driving the differential signal lines low after transmission of an EOP indicator for greater than 4 UI is contrary to eUSB2 standards and, in some examples, has a potential to cause incompatibility across eUSB2 devices.

At operation 515, the circuit is controlled to place the differential signal lines in a high-z state. The circuit places the differential signal lines in the high-z state, in at least some examples, by coupling the differential signal lines to the ground potential through a resistor or path having a resistance of about 7 kiloohms. In at least some examples, the circuit is controlled to place the differential signal lines in the high-z state after the circuit has driven the differential signal lines low for about $(4+\chi)$ UI. Despite driving the differential signal lines low for a period of time longer than permitted by eUSB2 standards, in at least some examples from a perspective of a receiver located on an opposite end of the differential signal lines from the transmitter and the circuit, the driving low of the differential signal lines is within the limits set forth by the eUSB2 standards. For example, because the differential signal lines include a propagation delay of $\chi$ UI and the circuit drove the differential signal lines low at the operation 510 for about $(4+\chi)$ UI prior to placing the differential signal lines in the high-z state at operation 515, the receiver only sees $((4+\chi)-\chi)$ UI, or simply 4 UI, worth of driven low logic '0' before the differential signal lines are placed in the high-z state. Therefore, from the perspective of the receiver, the transmission remains within eUSB2 standards and communication continues unaffected by the driving low of the differential signal lines for about $(4+\chi)$ UI.

While the operations of the method 500 have been discussed and labeled with numerical reference, in various examples the method 500 includes additional operations that are not recited herein (e.g., such as intermediary comparisons, logical operations, output selections such as via a multiplexer, etc.), in some examples any one or more of the operations recited herein include one or more sub-operations (e.g., such as intermediary comparisons, logical operations, output selections such as via a multiplexer, etc.), in some examples any one or more of the operations recited herein is omitted, and/or in some examples any one or more of the operations recited herein is performed in an order other than that presented herein (e.g., in a reverse order, substantially simultaneously, overlapping, etc.), all of which is intended to fall within the scope of the present disclosure.

In the foregoing discussion, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is said to include certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure either at a time of manufacture or after a time of manufacture, for example, by an end-user and/or a third-party.

While certain components are described herein as being of a particular process technology (e.g., FET, metal oxide semiconductor FET (MOSFET), n-type, p-type, drain-extended, natural, etc.), these components may be exchanged for components of other process technologies (e.g., replace FET and/or MOSFET with bi-polar junction transistor (BJT), replace n-type with p-type or vice versa, etc.) and reconfiguring circuits including the replaced components to provide desired functionality at least partially similar to functionality available prior to the component replacement. Components illustrated as resistors, unless otherwise stated, are generally representative of any one or more elements coupled in series and/or parallel to provide an amount of impedance represented by the illustrated resistor. Additionally, uses of the phrase "ground voltage potential" in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about", "approximately", or "substantially" preceding a value means +/− 10 percent of the stated value.

The above discussion is meant to be illustrative of the principles and various examples of the present disclosure. Numerous variations and modifications will become apparent to those skilled in the art once the above disclosure is fully appreciated. It is intended that the present disclosure be interpreted to embrace all such variations and modifications.

What is claimed is:

1. A system, comprising:
   an embedded Universal Serial Bus 2 (eUSB2) repeater having a first receiver and a first transmitter;
   a processor;
   a second transmitter coupled to the processor;
   a second receiver coupled to the processor; and
   differential signal lines having a length greater than ten inches, wherein the differential signal lines are coupled at a first end to the first receiver and the first transmitter, and at a second end to the second transmitter and the second receiver, wherein data is transmitted on the differential signal lines according to eUSB2 protocols;
   wherein the processor is configured to control the second transmitter to drive the differential signal lines low with a logic '0' to cause the first receiver to receive the logic 'O';
   wherein an X unit interval (UI) propagation delay exists on the differential signal lines, X being a non-negative integer value; and
   wherein UI is a period of time for transmitting 1 bit of data.

2. The system of claim 1, wherein the processor controls the second transmitter to drive the differential signal lines low with the logic '0' for about (Y+X) UI;
   Wherein Y is a non-negative value.

3. The system of claim 1, wherein after controlling the second transmitter to drive the differential signal lines low with the logic '0', the processor is further configured to control the transmitter to place the differential signal lines in a high-impedance (high-z) state.

4. The system of claim 3, wherein placing the differential signal lines in the high-z state comprises coupling the differential signal lines to a ground potential through a path having a resistance of 7 kiloohms.

5. The system of claim 3, wherein after the differential signal lines are placed in the high-z state, the first transmitter is configured to transmit differential data beginning with a start of packet (SOP) indicator to the second receiver.

6. The system of claim 1, wherein driving the differential signal lines low with the logic '0' comprises coupling the differential signal lines to a ground potential through a path having a resistance of 40 ohms.

\* \* \* \* \*